United States Patent [19]

Nieman et al.

[11] Patent Number: 4,954,794

[45] Date of Patent: Sep. 4, 1990

[54] FILTER CONTACT

[75] Inventors: Gerald R. Nieman, Glendale; Clarence L. Clyatt, III, Phoenix; Eric J. Paulus; Scott A. Zehrung, both of Scottsdale; Albert Ragl, Mesa, all of Ariz.; John R. Moore, Tustin, Calif.

[73] Assignee: ITT Corporation, New York, N.Y.

[21] Appl. No.: 335,413

[22] Filed: Apr. 10, 1989

[51] Int. Cl.[5] .......... H03H 7/00

[52] U.S. Cl. .......... 333/182; 333/185; 439/620

[58] Field of Search .......... 333/12, 181–185; 439/608, 620

[56] References Cited

U.S. PATENT DOCUMENTS

| | | | |
|---|---|---|---|
| 4,021,759 | 5/1977 | Campi | 333/182 |
| 4,198,613 | 4/1980 | Whitley | 333/185 X |
| 4,600,262 | 7/1986 | Nieman et al. | 439/608 |
| 4,700,155 | 10/1987 | Sakamoto et al. | 333/183 X |
| 4,746,310 | 5/1988 | Morse et al. | 333/185 X |
| 4,747,789 | 5/1988 | Gliha | 333/185 X |
| 4,768,977 | 9/1988 | Gliha, Jr. et al. | 333/182 X |
| 4,846,732 | 7/1989 | Meelhuysen | 333/185 X |

*Primary Examiner*—Eugene R. LaRoche
*Assistant Examiner*—Seung Ham
*Attorney, Agent, or Firm*—Thomas L. Peterson

[57] ABSTRACT

A contact assembly for installation in an electrical connector, provides effective electromagnetic filtering in a simple, compact, and rugged construction that facilitates in-field replacement of a damaged contact assembly. The contact assembly includes a signal conductor, a diode for diverting high voltages on the signal conductor to ground, and a "pi" filter for filtering out unwanted frequencies. The "pi" filter includes a ferrite bead inductor coupled to the signal conductor and a first capacitor coupling a location of the signal conductor on a first side of the inductor to ground. The other capacitor of the "pi" filter is formed by the capacitance of the diode, with the diode connected to a signal conductor location on a second side of the inductor, and with the capacitance of the diode similar or equal to that of the first capacitor. The diode is mounted in a notch of the signal conductor, the ferrite bead inductor lies immediately forward of the notch, and the first capacitor lies immediately forward of the ferrite bead. A ground conductor has a sleeve portion that immediately surrounds both the first capacitor and the ferrite bead, and has a finger contacting the diode. Solder holds the finger of the ground conductor in place both mechanically and electrically. A quantity of epoxy fills the remaining notch area and forms the middle of the assembly with a cylindrical periphery to facilitate insertion and removal from a long narrow hole in the connector.

10 Claims, 3 Drawing Sheets

FIG. 1
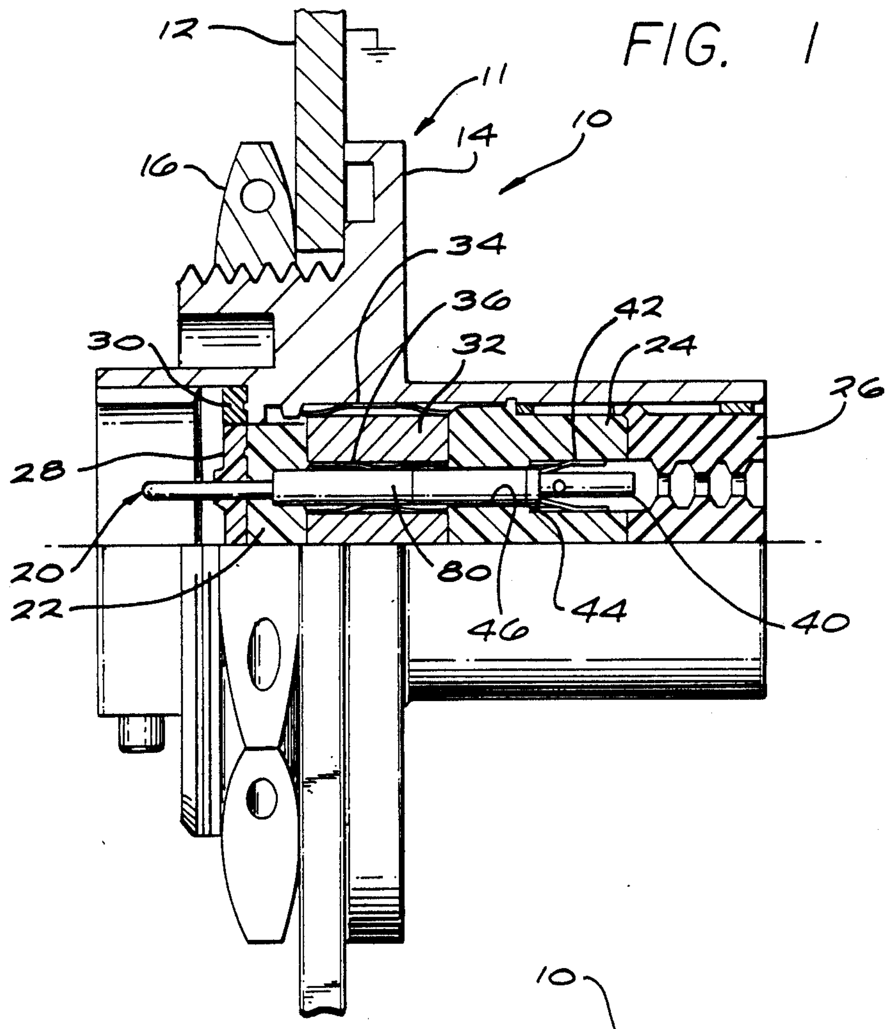
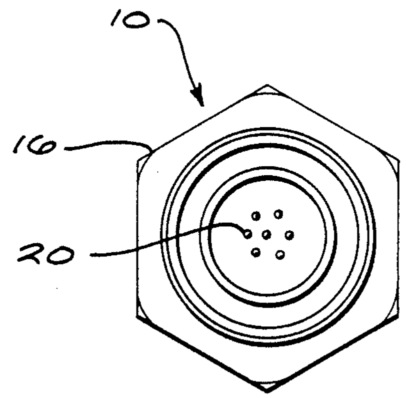
FIG. 2

FILTER CONTACT

BACKGROUND OF THE INVENTION:

In many applications, it is desirable to design connectors so their contact assemblies divert to ground any high voltage pulses induced by high energy electromagnetic pulses or static electricity, and also filter out frequency signals of unwanted frequencies induced by electromagnetic energy in the environment. Such unwanted signals are often referred to as EMP (electromagnetic pulse, ESD (electrostatic discharge), EMI (electromagnetic interference), and RFI (radio frequency interference), all of which may be referred to as EMX. While diodes and capacitive/capacitive-inductive filters have been connected to contacts of connectors to cancel the effects of EMX, the resulting contact assemblies have been relatively complex, which increases their cost, and have been relatively cumbersome. The cumbersome contact assemblies are difficult to replace by simply pulling out a defective one (which may be due to mechanical or electrical damage) from a long thin hole in the connector and inserting a new one in its place.

U.S. Pat. No. 4,747,789 by Gliha shows a connector with a diode and filter connected to a signal conductor, but the arrangement, especially the filter, is cumbersome, having a diameter many times greater than that of the signal conductor and not capable of easy replacement in the same manner as a simple signal contact. U.S. Pat. No. 4,746,310 by Morse shows an attempt to make a relatively compact contact assembly, with the diode lying in a notch in the signal conductor and with the inductor comprising a ferrite sleeve closely surrounding the signal conductor. However, the connector requires two large capacitors which are not part of the contact assembly so that replacement of the contact assembly does not replace the capacitors.

A contact assembly which minimized the number of components while providing effective filtering and transient suppression, and which resulted in a compact contact assembly with all filtering and suppression elements included in a thin and rugged assembly that could be easily inserted and removed from a small diameter hole in the connector for in-field replacement, would be of considerable value.

SUMMARY OF THE INVENTION:

In accordance with one embodiment of the present invention, a contact assembly is provided which is of relatively simple and compact design. The contact assembly includes a signal conductor which holds a diode, an inductor, and a first capacitor, with one side of the diode and capacitor being grounded. A largely balanced "pi" filter is formed by the inductor and first capacitor in conjunction with the capacitance of the diode. The diode lies on a side of the inductor opposite the first capacitor and preferably has a capacitance equal to that of the first capacitor. The inductor can be a ferrite sleeve or bead surrounding a location on the signal conductor, while the first capacitor is also sleeve-shaped and surrounds the signal conductor. A ground conductor includes a sleeve portion surrounding the first capacitor and connected thereto, the ground conductor including a portion extending by but spaced from the ferrite bead, and also including a finger extending against a face of the diode. The notch in the signal conductor which holds the diode, as well as adjacent portions of the contact assembly, are potted with a flowed but hardened plastic material such as epoxy which forms the middle of the contact assembly substantially cylindrical to facilitate insertion of the contact assembly into a thin hole in a connector.

The novel features of the invention are set forth with particularity in the appended claims. The invention will be best understood from the following description when read in conjunction with the accompanying drawings.

BRIEF DESCRIPTION OF THE DRAWINGS:

FIG. 1 is a partial sectional side view of a connector constructed in accordance with accordance with the present invention.

FIG. 2 is a front elevation view of the connector of FIG. 1.

Figure 3:
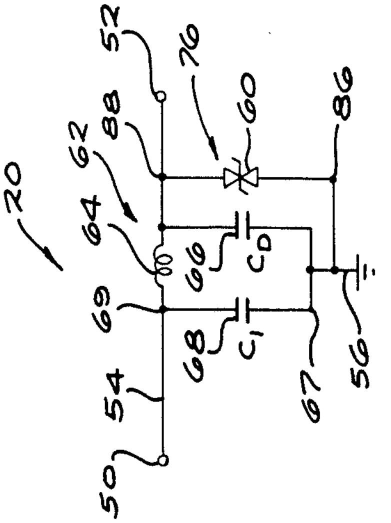
FIG. 3 is a schematic diagram of the circuitry of the contact assembly of the connector of FIG. 1.

DESCRIPTION OF THE PREFERRED EMBODIMENT:

FIG. 1 illustrates a connector 10, showing it mounted on an electrically grounded mounting plate 12. The connector includes a housing 11 with a metal shell 14 held to the mounting plate 12 by a jam nut 16. Several contact assemblies 20 are mounted within the shell, within a front insulator 22, a rear insulator 24, and a grommet 26 backing up the rear insulator. A face seal 28 seals the front of the contact assembly and is itself sealed by a peripheral seal 30. A metal ground plane 32 is electrically connected to the shell 14 by an outer ground spring 34, and is electrically connected to the contact assembly by an inner ground spring 36 at ground conductor 80. The rear 40 of the contact assembly is connected through conductors (not shown) with most of the contact assemblies carrying electrical signals. The contact assembly is held in the connector by a retention clip 42 which abuts a shoulder 44 on the contact assembly. The contact assembly can be replaced in the field by an extraction tool which spreads the fingers of the retention clip 42 and pulls up the contact assembly. A new contact assembly can be installed in the narrow largely cylindrical hole 46 in the connector by moving the connector assembly forwardly into the hole until the retention clip 42 springs behind the shoulder of the contact assembly. An insertion tool is sometimes used to aid in installation.

FIG. 3 is a schematic diagram of the circuitry of a contact assembly, showing that it has front and rear ends 50, 52 connected through a signal conductor 54 (which may carry signals and/or current for powering devices), and a ground 56. In many applications it is highly desirable to safeguard the contact assembly against EMP (electromagnetic pulses) that produce high voltages in the signal conductor, and against EMI (electromagnetic interference) which results in unwanted high frequency signals in the signal conductor. The high voltages are avoided by a diode 60 such as a Zener type which may be unipolar or bipolar depending on the protection required. The opposite terminals or sides 86, 88 of the diode are connected respectively to ground and to the signal conductor. EMI is avoided by a filter 62 which is a low pass filter that passes only signals below a certain frequency.

One of the most effective simple filters is a balanced "pi" filter which includes an inductor 64 coupled to the signal conductor 54, and two capacitors 66, 68 connecting locations along the signal conductor on opposite sides of the inductor 64, to ground. Best results are obtained when the filter is balanced, wherein the two capacitors 66, 68 have substantially equal capacitance. (Even better filtering is obtained by placing a resistance between the inductor and one of the capacitors, as will be described later herein.) Applicant minimizes the number of capacitors that have to be included in the contact assembly by using the capacitance that accompanies the diode 60 as one of the capacitors, and using a first capacitor 68 so its capacitance matches the capacitance of the diode. The entire diode with its diode function and capacitance is indicated as 76. The opposite terminals 67, 69 of the first capacitor 68 are connected respectively to ground and to the signal conductor. It should be noted that instead of an inductor 64, it is possible to use a resistor instead, as the inductor/resistor element, although this results in larger losses. Thus, the part 64 can be referred to as an "inductor/resistor" element.

Figure 4A:
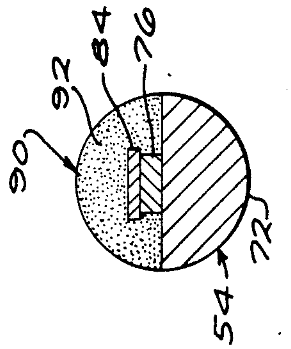
FIG. 4A is a sectional view taken on the line 4A—4A of FIG. 4.
Figure 4:
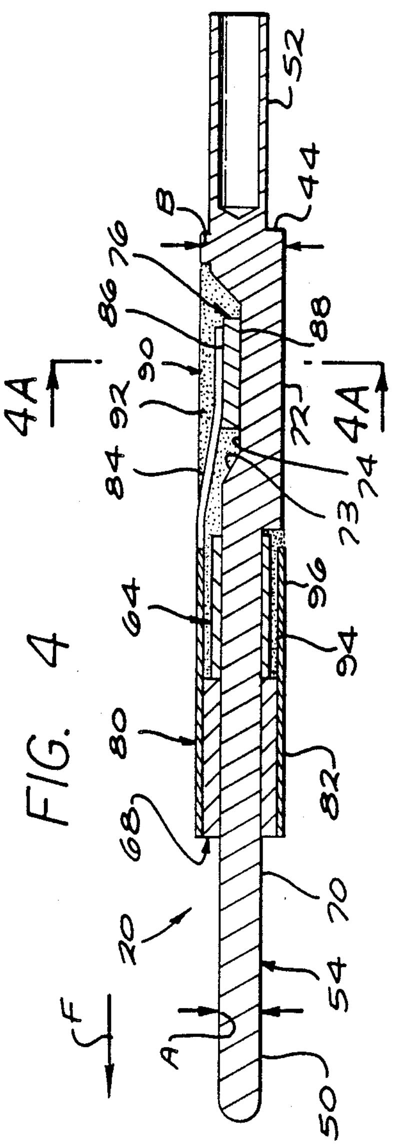
FIG. 4 is a sectional side view of the contact assembly of FIG. 1.
Figure 5:
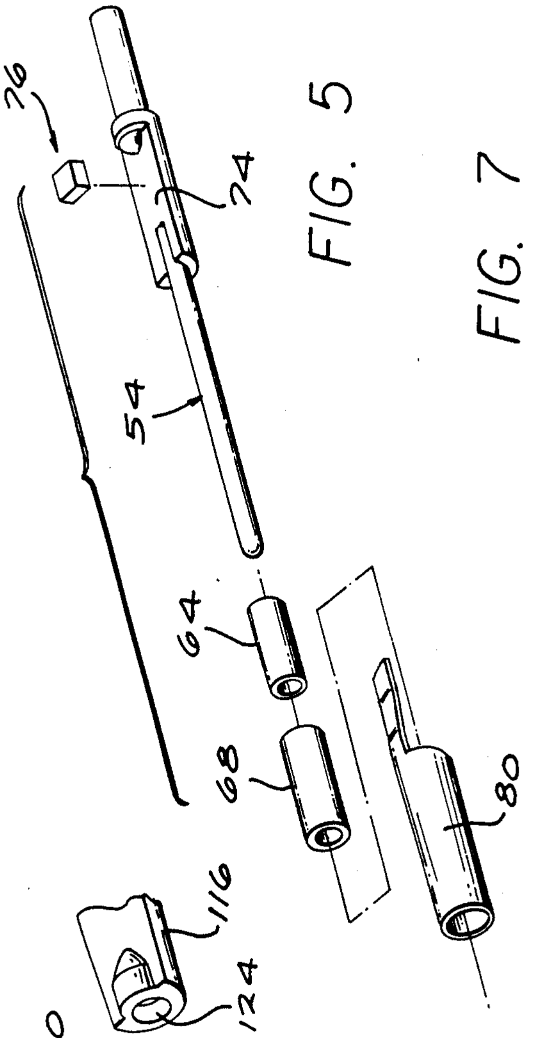
FIG. 5 is an exploded perspective view of the contact assembly of FIG. 4.

FIGS. 4 and 5 illustrate details of the contact assembly 20. To facilitate explanation, one direction F is considered to be the forward direction; however, the opposite could be considered the forward direction. The signal conductor 54 is formed with a forward end portion 70 in the shape of a pin with a small diameter cylindrical outer surface. The first capacitor 68 is a bead capacitor, and the inductor 64 is a ferrite bead, and both annular devices are mounted on the forward end portion 70 of the signal conductor. The signal conductor also includes a middle portion 72 forming a notch 73 with a platform 74 on which the diode 76 is mounted. A ground conductor 80 contacts the outer terminal of the first capacitor 68 and one side of the diode 76, to connect both to ground (through the inner ground spring 36 of FIG. 1). However, the ground conductor 80 is out of contact with the inductor 64. The ground conductor 80 includes a forward sleeve portion 82 which surrounds the first capacitor 68, and includes a rearwardly-extending finger 84 that contacts the diode. The opposite faces 86, 88 of the diode can be soldered to the platform 74 of the signal conductor, and to the finger 84 of the ground conductor. The first capacitor 68 has terminals on its radially inner and outer surfaces, and can be mechanically and electrically connected to the signal conductor 54 and the sleeve portion 82 of the ground conductor by soldering thereto. The ferrite bead inductor 64 is formed so its inside fits very closely around the signal contact portion 70 to closely couple them (the bead ferrite inductor does not have to be mechanically or electrically connected in series with the signal conductor. Its physical location on the signal conductor produces the desired electrical effect).

After the diode 76, inductor 64, first capacitor 68 and ground conductor 80 are installed on the signal conductor, applicant prefers to encapsulate them with a mass 90 of flowable and hardenable polymer such as epoxy. The middle portion 72 of the signal conductor with elements mounted thereon is placed in a substantially cylindrical mold, and epoxy is flowed into the mold to fill substantially all empty spaces. The epoxy includes a portion 92 lying in the notch 73 of the signal conductor around the diode 76 and finger 84, and also includes a portion 94 which lies between the inductor 64 and middle locations or parts 96 of the ground conductor 80 that lie directly around the inductor. Thus, the contact assembly 20 includes a diode for dissipating pulses and an effective filter for dissipating high frequency currents, in a relatively simple and compact assembly that can fit in the narrow holes formed in the connector into which contact assemblies can be inserted and removed.

In one design of applicant, the signal conductor 54 had a forward end of a diameter A of 30 mil (one mil equals one thousandth inch) and a greatest diameter B of 80 mil, and the diode 76 had a width and length each of 37 mil and a height of about 10 mil. The capacitance of the diode was about 2000 picofarads and the first capacitor 68 had a capacitance of 2000 picofarads. The diode includes a mass of diode material and terminals at its opposite sides, with a capacitance of over 100 picofarads for most diodes of this type. The inductor 64 had an inductance of 10 microhenrys. The diode 76 was a Zener diode which had a breakdown voltage of $\pm 6$ volts. The filter formed by the inductor 64, the first capacitor 68, and the capacitance of the diode 76 provide an attenuation of signals passing through the signal conductor 54 of 10 decibels at 10 megahertz. Substantial attenuation occurs only above about 1 megahertz, and therefore for this design the contact assembly is useful for carrying signals of a frequency up to about 1 megahertz.

Figure 6:
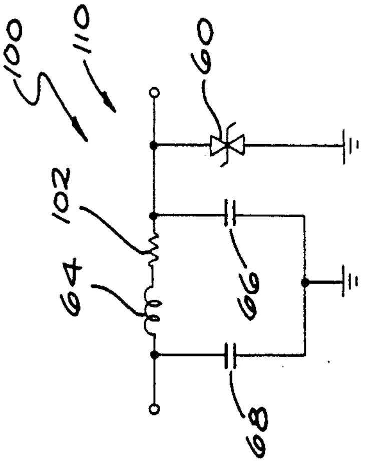
FIG. 6 is a schematic diagram of a contact assembly of another embodiment of the invention, which includes a resistor in its filter.

While a simple "pi" filter with a pair of capacitors coupling opposite sides of an inductor to ground is effective in blocking high frequency currents, even greater effectiveness is obtained with an RLC circuit, similar to a "pi" filter but with a resistor in series with the inductor. FIG. 6 illustrates a filter circuit 100 of this type, which includes a resistor 102 in addition to the inductor 64 (or instead of the inductor), first capacitor 68, and diode capacitor 66 which represents the capacitance of the diode 60. For a filter with capacitance and inductance values as described above, a resistor 102 having a resistance on the order of magnitude of 5000 ohms may be appropriate. Of course, the signal conductor 54 has a resistance, but it is negligible, while an effective filter resistance must be a plurality of ohms.

Figure 7:
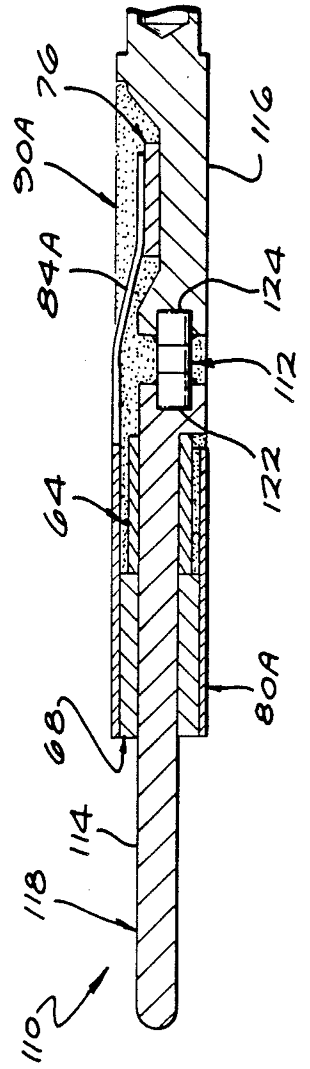
FIG. 7 is a sectional view of the contact assembly of FIG. 6.
Figure 8:
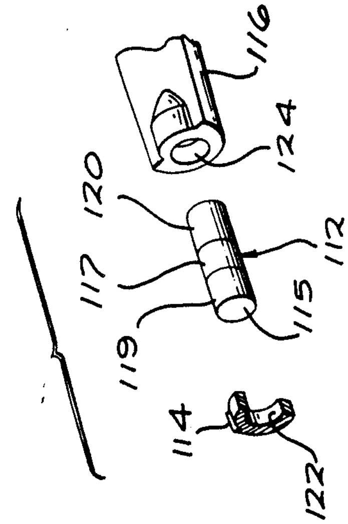
FIG. 8 is a partial perspective view of the contact assembly of FIG. 7.

FIG. 7 illustrates another contact assembly 110 largely similar to that of FIG. 4, except that it includes a resistance device 112 in series with forward and rearward parts 114, 116 of the signal conductor 118. The resistance device 112 includes a largely cylindrical dielectric element 115 (FIG. 8) with a resistive layer 117 thereon forming the resistor 102 and with conductive layers 119, 120 thereon. In constructing the device, the resistance layer 117 is first deposited on the dielectric element 115, and then the conductive layers 119, 120 are deposited with at least a portion of each conductive layer lying over the resistive layer. Each of the signal conductor parts 114, 116 is formed with a hole 122, 124 that closely receives an end of the dielectric element. The conductive layers 119, 120 are soldered respectively to the forward and rearward parts 114, 116, to thereby electrically connect the resistive layer in series with the conductive parts, and also to provide some mechanical connection. The ground conductor 80A is similar to that of FIG. 4, except that the finger 84A may be somewhat longer to account for the resistive device 112. After assembling the components, the assembly is encapsulated as with epoxy 90A, so that the parts are held together and a substantially smooth cylindrical outside is provided that is formed partially of a quantity of flowed and hardened plastic material.

Thus, the invention provides a contact assembly which is relatively simple and compact, to provide ruggedness and low cost and to facilitate in-field replacement of a defective contact assembly. The contact assembly includes a diode for dissipating pulses, and a filter which includes an inductor and which also includes capacitances coupling opposite sides of the inductor to ground, with one of the capacitances being that of the diode. The inductor and first capacitor can be in the form of beads surrounding a cylindrical portion of the signal conductor, while the ground conductor can be formed as a sleeve closely surrounding the bead capacitor, and extending across but out of contact with the inductor and with a finger contacting the diode. The assembly can be encapsulated with a quantity of a flowed but hardened plastic material such as epoxy, and with a substantially cylindrical exterior along the middle of the contact assembly, to hold all the parts together and enable the assembly to be easily replaced in the field.

Although particular embodiments of the invention have been described and illustrated herein, it is recognized that modifications and variations may readily occur to those skilled in the art and consequently it is intended to cover such modifications and equivalents.

What is claimed is:

1. In a connector with a housing and a plurality of filter contact assemblies in the housing, the improvement wherein each contact assembly comprises:

a signal conductor with first and second ends, an inductor/resistor element coupled to said signal conductor, a ground conductor, a diode connected between the signal and ground conductors, a first capacitor connected between said signal and ground conductors, said diode having a predetermined capacitance, said diode and first capacitor connected to locations along said signal conductor which lie on opposite sides of said inductor/resistor element, and said capacitor having a capacitance substantially equal to the capacitance of said diode.

2. The connector described in claim 1 wherein:

said first capacitor is a bead-like annular element and substantially surrounds said signal conductor, said diode lies on said signal conductor at a side of said inductor/resistor element which is opposite said first capacitor, and said ground conductor surrounds and contacts said first capacitor and extends across but out of contact with said inductor/resistor element and has a finger that contacts said diode.

3. A filtered contact assembly which can be installed in a connector housing, comprising:

a signal conductor having a pin-like cylindrical forward portion, a rearward portion, and a middle;

a bead capacitor lying closely around and electrically connected to said forward portion of said signal conductor;

a bead ferrite element lying closely around said forward portion of said signal conductor, behind said capacitor;

a diode having a first face lying against said middle of said signal conductor, and a second opposite face;

a ground conductor having a sleeve-shaped forward portion closely surrounding said capacitor, a rearward portion forming a finger in contact with said second face of said diode, and a middle portion extending across but out of contact with said ferrite element.

4. A contact assembly for installation in the housing of a connector comprising:

a signal conductor with forward and rearward end portions;

a ferrite bead surrounding and closely coupled to said forward portion of said signal conductor;

a ground conductor;

a first capacitance which includes a bead capacitor lying forward of said ferrite bead and said signal conductor forward portion, and having a first and second terminal coupled respectively to said signal conductor and to said ground conductor;

a second capacitance which includes a diode comprising a mass of diode material with opposite sides and first and second terminals at said opposite sides, said mass of diode material allowing current to flow without appreciable resistance between said diode terminals when the voltage between said diode terminals exceeds a predetermined level, and there being a capacitance over one hundred picofarads between said diode terminals, said diode being mounted on said signal conductor at a location rearward of said ferrite bead and with said diode terminals connected respectively to said signal conductor location and to said ground conductor, and said first and second capacitance being substantially equal.

5. The contact assembly described in claim 4 wherein:

said ground contact includes a sleeve portion mounted on and surrounding said bead capacitor and electrically connected thereto, a middle ground contact portion extending beside but spaced from said ferrite bead, and a finger portion in contact with a terminal of said diode.

6. In a connector with a housing and a plurality of filter contact assemblies in the housing, the improvement wherein each contact assembly comprises:

a signal conductor with first and second ends, an inductor/resistor element coupled to said signal conductor, a ground conductor, a diode connected between the signal and ground conductors, a first capacitor connected between said signal and ground conductors, said diode having a predetermined capacitance, said diode and first capacitor connected to locations along said signal conductor which lie on opposite sides of said inductor/resistor element, and said capacitor having a capacitance substantially equal to the capacitance of said diode;

said first capacitor is a bead-like annular element and substantially surrounds said signal conductor, said diode lies on said signal conductor at a side of said inductor/resistor element which is opposite said first capacitor, and said ground conductor surrounds and contacts said first capacitor and extends across but out of contact with said inductor/resistor element and has a finger that contacts said diode;

a quantity of flowed and hardened plastic material filling the space between said ground conductor and said inductor/resistor element, substantially surrounding said ground conductor finger and diode, and bonded to said signal conductor, to hold said ground conductor securely out of contact with said inductor/resistor element and in contact with said diode.

7. In a connector with a housing and a plurality of filter contact assemblies in the housing, the improvement wherein each contact assembly comprises:

a signal conductor with first and second ends, an inductor/resistor element coupled to said signal conductor, a ground conductor, a diode connected between the signal and ground conductors, a first capacitor connected between said signal and ground conductors, said diode having a predetermined capacitance, said diode and first capacitor connected to locations along said signal conductor which lie on opposite sides of said inductor/resistor element, and said capacitor having a capacitance substantially equal to the capacitance of said diode;

said first capacitor is a bead-like annular element and substantially surrounds said signal conductor, said diode lies on said signal conductor at a side of said inductor/resistor element which is opposite said first capacitor, and said ground conductor surrounds and contacts said first capacitor and extends across but out of contact with said inductor/resistor element and has a finger that contacts said diode;

said signal conductor includes forward and rearward parts, said inductor/resistor element includes a resistance device having a resistance of a plurality of ohms electrically connecting said signal conductor parts, said diode lies on and is connected to one of said signal conductor parts and said first capacitor is connected to the other of said signal conductor parts.

8. A filtered contact assembly which can be installed in a connector housing, comprising:

a signal conductor having a pin-like cylindrical forward portion, a rearward portion, and a middle;

a bead capacitor lying closely around and electrically connected to said forward portion of said signal conductor;

a bead ferrite element lying closely around said forward portion of said signal conductor, behind said capacitor;

a diode having a first face lying against said middle of said signal conductor, and a second opposite face;

a ground conductor having a sleeve-shaped forward portion closely surrounding said capacitor, a rearward portion forming a finger in contact with said second face of said diode, and a middle portion extending across but out of contact with said ferrite element;

a quantity of flowed and hardened plastic material disposed about said ground conductor finger, said diode, and a portion of said signal conductor middle that lies behind said ground conductor forward portion, said plastic material forming part of a largely cylindrical exterior surface at said middle of said signal conductor, whereby to hold the parts together to facilitate rearward removal of a defective contact assembly and the forward insertion of a new one in its place.

9. A contact assembly for installation in the housing of a connector comprising:

a signal conductor with forward and rearward end portions;

a ferrite bead surrounding and closely coupled to said forward portion of said signal conductor;

a ground conductor;

a first capacitance which includes a bead capacitor lying forward of said ferrite bead and said signal conductor forward portion, and having a first and second terminal coupled respectively to said signal conductor and to said ground conductor;

a second capacitance which includes a diode comprising a mass of diode material with opposite sides and first and second terminals at said opposite sides, said mass of diode material allowing current to flow without appreciable resistance between said diode terminals when the voltage between said diode terminals exceeds a predetermined level, and there being a capacitance over one hundred picofarads between said diode terminals, said diode being mounted on said signal conductor at a location rearward of said ferrite bead and with said diode terminals connected respectively to said signal conductor location and to said ground conductor, and said first and second capacitance being substantially equal;

said signal conductor includes separate forward and rearward parts, and including a resistive device having a predetermined resistance and electrically connecting said parts of said signal conductor, said resistance lying between said ferrite bead and one of said capacitances.

10. A contact assembly for installation in the housing of a connector comprising:

a signal conductor with forward and rearward end portions;

a ferrite bead surrounding and closely coupled to said forward portion of said signal conductor;

a ground conductor;

a first capacitance which includes a bead capacitor lying forward of said ferrite bead and said signal conductor forward portion, and having a first and second terminal coupled respectively to said signal conductor and to said ground conductor;

a second capacitance which includes a diode comprising a mass of diode material with opposite sides and first and second terminals at said opposite sides, said mass of diode material allowing current to flow without appreciable resistance between said diode terminals when the voltage between said diode terminals exceeds a predetermined level, and there being a capacitance over one hundred picofarads between said diode terminals, said diode being mounted on said signal conductor at a location rearward of said ferrite bead and with said diode terminals connected respectively to said signal conductor location and to said ground conductor, and said first and second capacitance being substantially equal;

said ground contact includes a sleeve portion mounted on and surrounding said bead capacitor and electrically connected thereto, a middle ground contact portion extending beside but spaced from said ferrite bead, and a finger portion in contact with a terminal of said diode;

a quantity of hardened epoxy-like plastic disposed about said diode and said ground conductor finger, and between said ferrite bead and said middle ground contact portion, and forming at least part of a substantially cylindrical periphery.

* * * * *